US007063900B2

(12) United States Patent
Shiang et al.

(10) Patent No.: US 7,063,900 B2
(45) Date of Patent: Jun. 20, 2006

(54) WHITE LIGHT-EMITTING ORGANIC ELECTROLUMINESCENT DEVICES

(75) Inventors: Joseph John Shiang, Niskayuna, NY (US); Anil Raj Duggal, Niskayuna, NY (US); Gautam Parthasarathy, Saratoga Springs, NY (US)

(73) Assignee: General Electric Company, Niskayuna, NY (US)

(*) Notice: Subject to any disclaimer, the term of this patent is extended or adjusted under 35 U.S.C. 154(b) by 120 days.

(21) Appl. No.: 10/328,263

(22) Filed: Dec. 23, 2002

(65) Prior Publication Data

US 2005/0260439 A1 Nov. 24, 2005

(51) Int. Cl.
*H05B 33/00* (2006.01)
*H01L 21/00* (2006.01)
(52) U.S. Cl. .................... 428/690; 428/917; 427/66
(58) Field of Classification Search ............. 428/690, 428/917; 313/504, 506; 252/301.16; 427/66; 430/321
See application file for complete search history.

(56) References Cited

U.S. PATENT DOCUMENTS

| 5,294,870 | A | 3/1994 | Tang et al. ............... 313/504 |
| 6,004,685 | A | 12/1999 | Antoniadis et al. ........ 428/690 |
| 6,023,371 | A | 2/2000 | Onitsuka et al. ........... 359/620 |
| 6,030,715 | A | 2/2000 | Thompson et al. ........ 428/690 |
| 6,048,630 | A | 4/2000 | Burrows et al. ........... 428/690 |
| 6,127,693 | A | 10/2000 | Chen et al. .................. 257/40 |
| 6,303,238 | B1 | 10/2001 | Thompson et al. ........ 428/690 |
| 6,329,084 | B1 | 12/2001 | Tamano et al. ............. 428/690 |
| 6,329,085 | B1 | 12/2001 | Burrows et al. ........... 428/690 |
| 6,333,122 | B1 | 12/2001 | Furukawa et al. ......... 428/690 |
| 6,365,270 | B1 | 4/2002 | Forrest et al. ............. 428/336 |
| 6,392,250 | B1 | 5/2002 | Aziz et al. .................. 257/40 |
| 6,403,238 | B1 | 6/2002 | Horhold et al. ............ 428/690 |
| 2002/0034656 | A1* | 3/2002 | Thompson et al. ........ 428/690 |
| 2003/0111955 | A1* | 6/2003 | McNulty et al. ........... 313/504 |

FOREIGN PATENT DOCUMENTS

| EP | 1215945 | 12/2001 |
| WO | 0142218 | 6/2001 |
| WO | 0145469 | 6/2001 |

OTHER PUBLICATIONS

Uekawa et al., Bulletin of the Chemical Society of Japan, (1998), 71(9), pp. 2253-2258.*
Liu et al., Synthetic Metals, 91 (1997), pp. 267-269.*
McGehee et al., Advanced Materials, (1999), vol. 11, No. 16, pp. 1349-1354.*
Kido et al., Japanese Journal of Applied Physics, Part 2: Letters, 35, (3B), L394-L396, (1996).*
H. Suzuki et al., Near-Ultraviolet Electroluminescence from Polysilanes, Thin Solid Films, vol., 331, 64-70 (1998).
I. Seguy et al., "Red Organic Light Emitting Device Made From Triphenylene Hexaeter and Perylene Tetraester," Journal of Applied Physics, vol. 89, No. 10, 5442 (2001).

C. Adachi et al., Electroluminescence Mechanisms in Organic Light-Emitting Devices Employing a Europium Chelate Doped in a Wide Band Gap Bipolar Conducting Host,: Journal of Applied Physics, vol. 87, No. 11, 8049 (2000).
H. Heil et al., "Tris(dibenzoylmethane)(monophenanthroline) europium(III) Based Red Emitting Organic Light Emitting Diodes," Journal of Applied Physics, vol. 90, No. 10, 5347 (2001).
Y. Kawamura, "Energy Transfer in Polymer Electrophosphorescent Light Emitting Devices with Single and Multiple Doped Luminescent Layers," Journal of Applied Physics, vol. 92, No. 1 87 (2002).
P.F. Gordon & P. Gregory, "Organic Chemistry in Colour," Springer Verleg, Berlin, pp. 99-101, 105-106, 126, 180, 253-255, 257 (1983).
U.S. Appl. No. 09/683,345, Light-Emitting Device With Organic Electroluminescent Material and Photoluminescent Materials, Anil R. Duggal et al., Filed Dec. 17, 2001.
B. W. D'Andrade et al., "High-Efficiency Yellow Double-Doped Organic Light-Emitting Devices Based on Phosphor-Sensitized Fluorescence," Applied Physics Letters., vol. 79, No. 7, 1045 (2001).
F. Liang et al., "Oxadiazole-Containing Material with Intense Blue Phosphorescence Emission for Organic Light-Emitting Diodes," Applied Physics Letters., vol. 81, No. 1, 4 (2002).
G. He et al, "Highly Efficient Polymer Light-Emitting Devices Using a Phosphorescent Sensitizer," vol. 81, No. 8, 1509 (2002).
R. W. T. Higgins et al., "Effects of Singlet and Triplet Energy Transfer to Molecular Dopants in Polymer Light-Emitting Diodes and their Usefulness in Chromaticity Tuning," Applied Physics Letters, vol. 79, No. 6, 857 (2001).
M.A. Baldo et al., "Very High-Efficiency Green Organic Light-Emitting Devices Based on Electrophosphorescence," Applied Physics Letters, vol. 75, No. 1, 4 (1999).

(Continued)

*Primary Examiner*—Dawn Garrett
(74) *Attorney, Agent, or Firm*—Jason K. Klindtworth; William E. Powell, III

(57) ABSTRACT

A light-emitting device comprises a light-emitting member, which comprises two electrodes, at least two organic electroluminescent ("EL") materials disposed between the electrodes, a charge blocking material disposed between the electrodes, and at least one photoluminescent ("PL") material. The light-emitting member emits electromagnetic ("EM") radiation having a first spectrum in response to a voltage applied across the two electrodes. The PL material absorbs a portion of the EM radiation emitted by the light-emitting member and emits EM radiation having second spectrum different than the first spectrum. Each of the organic EL materials emits EM radiation having a wavelength range selected from the group consisting of blue and red wavelength ranges.

43 Claims, 5 Drawing Sheets

OTHER PUBLICATIONS

R. C. Kwong et al., "High Opertional Stability of Electrophosphorescent Devices," Applied Physics Letters, vol. 81, No. 1, 162 (2002).

O.M. Khresis et al., "Infrared Organic Light Emitting Diodes Using Neodymium Tris-(8-hydroxyquinoline)", Journal of Applied Physics, vol. 88, No. 2, 777 (2000).

* cited by examiner

WHITE LIGHT-EMITTING ORGANIC ELECTROLUMINESCENT DEVICES

This invention was first conceived or reduced to practice in the performance of work under contract DE-FC26-00NT-40989 awarded by the United States Department of Energy. The United States of America may have certain rights to this invention.

BACKGROUND OF THE INVENTION

The present invention relates generally to light-emitting devices having at least two organic electroluminescent materials that emit light having different wavelength ranges and, more particularly, to light-emitting devices wherein a portion of light emitted from at least one of the organic electroluminescent materials is modified by organic and/or inorganic photoluminescent materials.

Electroluminescent ("EL") devices, which may be classified as either organic or inorganic, are well known in graphic display and imaging art. EL devices have been produced in different shapes for many applications. Inorganic EL devices, however, typically suffer from a required high activation voltage and low brightness. On the other hand, organic EL devices ("OELDs"), which have been developed more recently, offer the benefits of lower activation voltage and higher brightness in addition to simple manufacture, and, thus, the promise of more widespread applications.

An OELD is typically a thin film structure formed on a substrate such as glass or transparent plastic. A light-emitting layer of an organic EL material and optional adjacent organic semiconductor layer are sandwiched between a cathode and an anode. The organic semiconductor layers may be either hole (positive charge)-injecting or electron (negative charge)-injecting layers and also comprise organic materials. The material for the light-emitting layer may be selected from many organic EL materials that emit light having different wavelengths. The light emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometers. To obtain white light, prior-art devices have incorporated closely arranged OELDs emitting blue, green, and red light. These colors are mixed to produce white light. An alternate scheme to produce white light is set forth in U.S. Pat. No. 5,294,870 which describes an organic EL multicolor display device comprising an organic EL source emitting blue light with green- and red-emitting fluorescent materials applied to different subpixel areas. This device emits different colors from the different subpixel areas by color shifting with the green- and red-emitting fluorescent materials. However, the manufacture of such microdevices is complex and requires sophisticated technologies.

Another example of an OELD is described in Junji Kido et al., "Multilayer White Light-Emitting Organic Electroluminescent Device," 267 Science 1332–1334 (1995). This device includes three emitter layers with different carrier (or charge) transport properties, each emitting blue, green, or red light, which layers are used together to generate white light. However, the formation of successive layers requires a high degree of care so that the interfaces between the layers do not introduce unnecessary barriers to charge transport. In this device, the layers emitting the different colors typically degrade over time at different rates. Consequently, the color of light emitted from the device is likely to change over time. In addition, the uniformity of the light output over the emitting area of the device may be less than desirable because of imperfections at the interfaces between the layers.

Although encouraging progress has been achieved in improving OELDs, the efficiency of these devices is still low. Therefore, it is still very desirable to provide light sources based on organic EL materials that emit light at controllable wavelengths that have improved efficiency and that is simple to manufacture. It is also desirable to use such light sources to produce white light.

SUMMARY OF THE INVENTION

A light-emitting device of the present invention comprises: (1) a light-emitting member that comprises two electrodes and at least two organic EL materials that are disposed between the electrodes and, each of the organic EL materials emitting EM radiation having one of two different first and second wavelength ranges in response to an electrical voltage applied across the electrodes; and (2) at least one photoluminescent ("PL") material (also called "phosphor") optically coupled with the light-emitting member such that the phosphor material absorbs a portion of EM radiation emitted by at least one of the organic EL materials and emit EM radiation in a third wavelength range. The light-emitting member is disposed on a substrate. In one aspect of the present invention particles of the PL material can act as a light-scattering material. The EM radiation that is emitted by the organic EL materials and not absorbed by the phosphor is mixed with the EM radiation having the third spectrum to produce light having a desired color.

According to one aspect of the present invention, the phosphor is dispersed separately in a layer of polymeric materials.

The present invention also provides a method for producing a light-emitting device based on at least two organic EL materials that emit EM radiation in first and second wavelength ranges. The method comprises the steps of: (1) providing a substrate; (2) forming a light-emitting member in a process comprising the steps of: (a) depositing a first electrically conducting material on one surface of said substrate to form a first electrode; (b) disposing said at least two organic EL materials on said first electrode; and (c) depositing a second electrically conducting material on said organic EL material to form a second electrode; and (3) disposing at least one PL material optically coupled with said light-emitting member such that said PL material absorbs a portion of EM radiation emitted by one of said organic EL materials and emits EM radiation in a third wavelength range.

According to still another aspect of the present invention, the method for producing a light-emitting device further comprises disposing nanoparticles (particles having nanometer size) or microparticles (particles having micrometer size) of a scattering material adjacent to the PL material.

Other features and advantages of the present invention will be apparent from a perusal of the following detailed description of the invention and the accompanying drawings in which the same numerals refer to like elements.

DETAILED DESCRIPTION OF THE INVENTION

Figure 1:
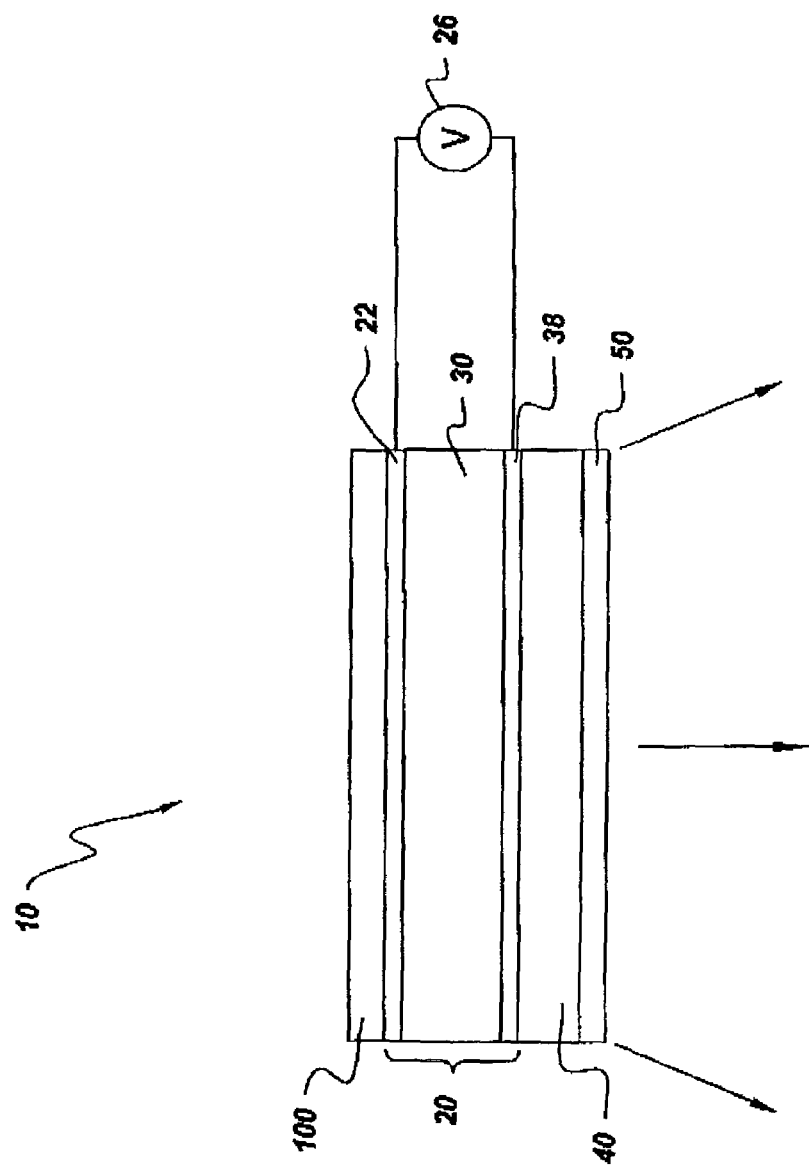
FIG. 1 shows schematically an embodiment comprising a light-emitting member and a layer of an organic PL material.

The present invention provides a light-emitting device, a light source, or a display wherein light having two different wavelength ranges emits from at least two organic EL materials and a portion of such emitted light is modified by a PL material to provide light having a desired color. In one embodiment, a PL material or phosphor may be an organic or inorganic material that absorbs a portion of light emitted by the organic EL materials and emits in a third wavelength range. A light-emitting device of the present invention comprises a light-emitting member based on the organic EL materials and one or more PL materials disposed adjacent and optically coupled to the light-emitting member. In one embodiment of the present invention, the light-emitting member is disposed on a substrate. In this embodiment, the organic EL and PL materials are formed to cover a substantial portion, for example, greater than about 10 percent and up to substantially 100 percent of the surface area of the substrate. In another embodiment of the present invention, the light-emitting member is formed into objects having desired shapes on the substrate.

Many organic EL materials are capable of emitting light having various wavelength ranges from near UV to deep red (i.e., from about 300 nm to about 800 nm). Preferably, a light-emitting device of the present invention comprises at least two organic EL materials: the first organic EL material emitting in the blue region (i.e., from about 350 nm to about 500 nm), and the second in the red region (i.e., from about 600 nm to about 770 nm). The two organic EL materials can be disposed as a mixture in one EL layer or as two separate EL layers, each containing one organic EL material. Each organic EL layer may be formed entirely of one or more organic EL materials or of a mixture of organic EL materials and a matrix material, such as a substantially transparent polymer. The term "substantially transparent" means allowing at least 80 percent, preferably at least 90 percent, and more preferably at least 95 percent, of light in the visible wavelength range transmitted through a film having a thickness of about 0.5 micrometer.

When a voltage is applied across an organic EL material, positive charges (holes) and negative charges (electrons) are injected from the electrodes into the organic EL material, wherein they combine to form excited molecules ("excitons") at high energy, which subsequently drop to a lower energy level, concurrently emitting electromagnetic ("EM") radiation. The high-energy excitons are in either singlet excited state or triplet excited state, which is lower in energy than the singlet state. It is generally believed that only the singlet state decays in a radiative process, which produces emission of visible light. Therefore, if the triplet-state energy of one organic EL material can be transferred to another organic EL material, from which the excited state can decay in a radiative process, the overall energy efficiency of the device would be enhanced. In other words, it is believed that the use of at least two EL materials can improve the energy efficiency of the light-emitting device by a process of transferring at least a part of the energy of an excited state of molecules of one organic EL material, which energy would otherwise be lost through a non-radiative decay process, to an excited state of molecules of a second organic EL material which would decay more favorably through a radiative process.

FIG. 1 is a schematic diagram of a first embodiment of the present invention. It should be understood that the drawings accompanying this disclosure are not drawn to scale. Light-emitting device 10 comprises a light-emitting member 20 based on at least two organic EL materials: at least one emitting in the blue region and one in the red region of EM radiation spectrum. The organic EL materials are mixed together and formed into EL layer 30. Alternatively, the organic EL materials are blended into a substantially transparent polymer matrix and formed into EL layer 30, which is disposed between two electrode layers 22 and 38. When a red-emitting material is used to harvest energy from the triplet state of the blue-emitting material, the red-emitting material should have a lower triplet-state energy than that of the blue-emitting material, and a higher singlet-state energy than that of the blue-emitting material. Alternatively, when the blue-emitting and red-emitting materials are disposed in the same EL layer, the red-emitting material is provided only in a sufficient amount to harvest the triplet energy, but not excessive to harvest the single energy, from the blue-emitting material. Examples of suitable polymer matrix materials are polyethyleneterephthalate ("PET"), polyacrylates, polycarbonates, polyesters, polysulfones, polyetherimides, silicone, epoxy resins, and silicone-functionalized epoxy resins. Other suitable polymer matrix materials are semiconductive polymers, such as those having conjugated bond systems, as disclosed below. In still another embodiment, an electron-transporting material can be doped into EL layer 30 to enhance the charge conduction in this layer. Examples of electron-transporting materials are disclosed below.

In one embodiment, electrode layer 22 is a cathode injecting negative charge carriers (electrons) into organic EL layer 30, and electrode layer 38 is an anode injecting positive charge carriers (holes) into EL layer 30 when a voltage is supplied by a voltage source 26 across the pair of electrode layers 22 and 38. Light-emitting member 20 comprises EL layer 30 and electrode layers 22 and 38 and is disposed on a substantially transparent substrate 40. In this embodiment, anode layer 38 is disposed adjacent to substrate 40. However, in another embodiment, cathode layer 22 may be disposed adjacent to substrate 40 if such cathode layer is manufactured to be substantially transparent. A layer 50 comprising at least a PL material is disposed to receive at least a portion of light emitted from light-emitting member 20. In this embodiment, layer 50 is disposed adjacent to substrate 40. The PL material is dispersed into a film-forming material, such as one or a mixture of the polymers disclosed above.

Substrate 40 may be a single piece or a structure comprising a plurality of adjacent pieces of different materials and has an index of refraction (or refractive index) in the range from about 1.05 to about 2.5, preferably from about 1.1 to about 1.55. Preferably, substrate 40 is made of a substantially transparent glass or polymeric material. Examples of suitable polymeric materials are PET, polyacrylates, polycarbonates, polyesters, polysulfones, polyetherimides, silicone, epoxy resins, and silicone-functionalized epoxy resins. In one embodiment of the present invention, the PL material may be dispersed in the substrate material.

Cathode layer 22 is made of a material having a low work function; e.g., less than about 4 eV, such as K, Li, Na, Mg, La, Ce, Ca, Sr, Ba, Al, Ag, In, Sn, Zn, Zr, Sm, Eu, alloys thereof, or mixtures thereof. Preferred materials for the manufacture of cathode layer 22 are Ag-Mg, Al-Li, In-Mg, and Al-Ca alloys. Layered non-alloy structures are also possible, such as a thin layer of a metal such as Ca (thickness from about 1 to about 10 nm) or a non-metal such as LiF, covered by a thicker layer of some other metal, such as aluminum or silver. Anode layer 38 is made of a material having a high work functions; e.g., greater than about 4.5 eV, preferably from about 5 eV to about 5.5 eV. Indium tin oxide ("ITO") is typically used for this purpose. ITO is substantially transparent to light transmission and allows light emitted from organic electroluminescent layer 30 easily to escape through the ITO anode layer without being seriously attenuated. Other materials suitable for use as the anode layer are tin oxide, indium oxide, zinc oxide, indium zinc oxide, zinc indium tin oxide, antimony oxide, and mixtures thereof. Electrode layers 22 and 38 may be deposited on the underlying element by physical vapor deposition, chemical vapor deposition, or sputtering. A thin, substantially transparent layer of a metal is also suitable.

Light-emitting device 10 can advantageously include a protective layer 100 disposed on cathode layer 22 to provide protection against physical damage or chemical attack to the sensitive components of light-emitting member 20. Protective layer 100 can comprise a substantially transparent polymer or a glass.

Organic EL layer 30 serves as the transport medium for both holes and electrons. In this layer these charge species combine to form an exciton and drop to a lower energy level, concurrently emitting EM radiation in the visible range. At least one organic EL material is chosen to electroluminesce in the blue region (having wavelength in the range from about 380 nm to about 500 nm), and at least one EL material in the red region (having wavelength in the range from about 600 nm to about 770 nm). Preferably, a light-emitting device of the present invention includes only organic EL materials, each of which electroluminesces either in the blue or red region. The thickness of the organic EL layer 40 is preferably kept in the range of about 100 to about 300 nm. The organic EL material may be a polymer, a copolymer, a mixture of polymers, or lower molecular-weight organic molecules having unsaturated bonds. Such materials possess a delocalized $\pi$-electron system, which gives the polymer chains or organic molecules the ability to support positive and negative charge carriers with high mobility.

Suitable blue light-emitting EL polymers are poly(N-vinylcarbazole) ("PVK", emitting violet-to-blue light in the wavelengths of about 380–500 nm); poly(alkylfluorene) such as poly(9,9-dihexylfluorene) (410–550 nm), poly(dioctylfluorene) (wavelength at peak EL emission of 436 nm), or poly{9,9-bis(3,6-dioxaheptyl)-fluorene-2,7-diyl} (400–550 nm); poly(praraphenylene) derivatives such as poly(2-decyloxy-1,4-phenylene) (400–550 nm). Mixtures of these polymers or copolymers based on one or more of these polymers and others may be used to tune the color of emitted light.

Another class of suitable EL polymers emitting blue light is the polysilanes. Polysilanes are linear silicon-backbone polymers substituted with a variety of alkyl and/or aryl side groups. They are quasi one-dimensional materials with delocalized $\sigma$-conjugated electrons along polymer backbone chains. Examples of polysilanes are poly(di-n-butylsilane), poly(di-n-pentylsilane), poly(di-n-hexylsilane), poly(methylphenylsilane), and poly{bis(p-butylphenyl)silane} which are disclosed in H. Suzuki et al., "Near-Ultraviolet Electroluminescence From Polysilanes," 331 Thin Solid Films 64–70 (1998). These polysilanes emit light having wavelength in the range from about 320 nm to about 420 nm.

Organic materials having molecular weight less than about 5000 that are made of a large number of aromatic units are also applicable blue light-emitting materials. An example of such materials is 1,3,5-tris{n-(4-diphenylaminophenyl) phenylamino}benzene, which emits light in the wavelength range of 380–500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415–457 nm, aluminum-(picolymethylketone)-bis{2,6-di(t-butyl)phenoxide} or scandium-(4-methoxy-picolylmethylketone)-bis(acetylacetonate), which emits in the range of 420–433 nm.

Many red-emitting EL materials that are conjugated polymer systems or organometallic materials can be used in a device of the present invention. Suitable red-emitting organic EL polymer are alkoxy-substituted poly(paraphenylene vinylene) having an emission peak between 550 nm and 600 nm, as disclosed in U.S. Pat. No. 6,127,693, such as poly{2-methoxy-5(2'-ethyl-hexyloxy)-1,4-phenylene-1,2-ethylene-2,5-dimethoxy-1,4-phenylene-1,2-ethylene}, as disclosed in U.S. Pat. No. 6,403,238, and polythiophene, as disclosed in U.S. Pat. No. 6,365,270. These patents are incorporated herein by reference.

Another class of red-emitting organic small molecules in perylene tetraesters and triphenylene hexaethers, such as perylene tetraethylester (formula I) and triphenylene hexabutylether (formula II), as disclosed by I. Seguy et al., "Red Organic Light Emitting Device Made From Triphenylene Hexaether and Perylene Tetraester," J. Appl. Phys., Vol. 89, No. 10, 5442 (2001), and amino-substituted perylene derivatives, as disclosed in U.S. Pat. No. 6,329,084, which is incorporated herein by reference.

Other suitable red-emitting small organic molecules are the azlactone derivatives, such as those disclosed in U.S. Pat. No. 6,030,715 (one of which is represented by formula III); dibenzotetraphenylperiflanthene, as disclosed in U.S. Pat. No. 6,004,685; derivatives of pentacene (one of which is represented by formula IV) wherein the rings are substituted with at least two aromatic or heteroaromatic groups, as disclosed in PCT patent application WO 01/45469 A1; and quinoline derivatives (represented by formula V), such as those disclosed in PCT patent application WO 01/42218 A1, and pyran derivatives (represented by formula VII), one of which is disclosed in European patent application EP 1215945 A2. These patents and patent applications are incorporated herein by reference.

A suitable derivative of azlactone is

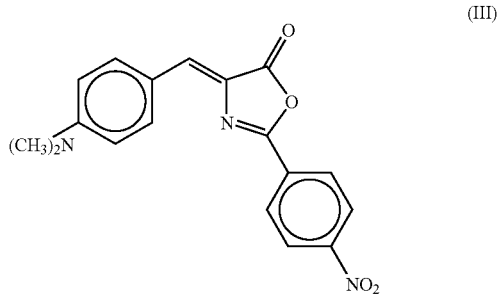

(III)

A group of derivatives of pentacene suitable to be used in a device of the present invention is:

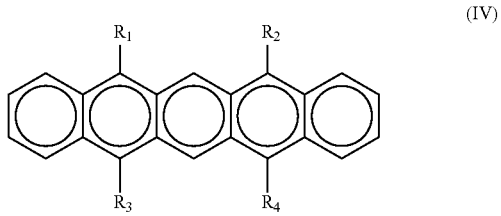

(IV)

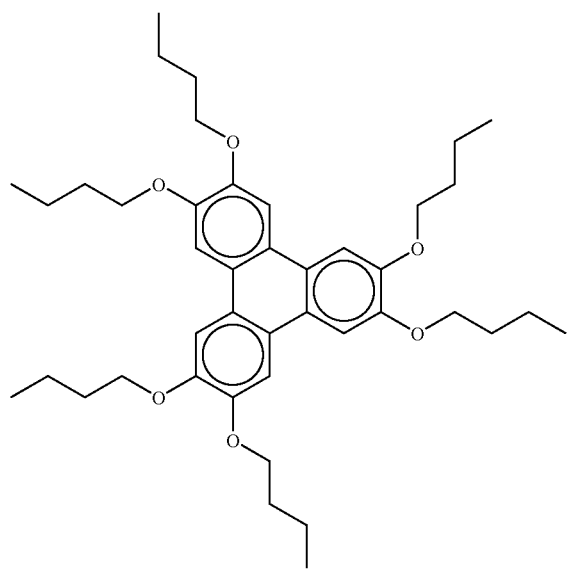

(I)

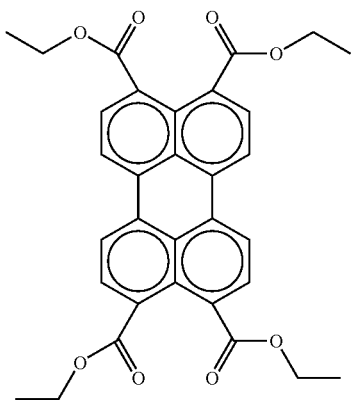

(II)

wherein each of $R_1$, $R_2$, $R_3$, and $R_4$ is independently selected from the group consisting of aromatic, substituted aromatic, heteroaromatic, or substituted heteroaromatic groups. It should be understood that $R_1$, $R_2$, $R_3$, and $R_4$ independently can be attached to other rings in the pentacene molecule.

Quinoline derivatives suitable for used in the present invention are represented by formula V:

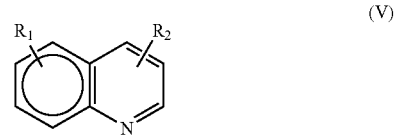

(V)

wherein $R_1$ and $R_2$ are independently represented by

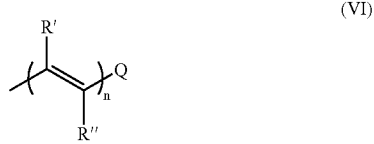

wherein R' an R" are independently selected from alkylaryl, akenylaryl, and heteroaryl groups, and n is from 1 to 3, inclusive.

A pyran derivative suitable for use in a device of the present invention is represented by formula VII:

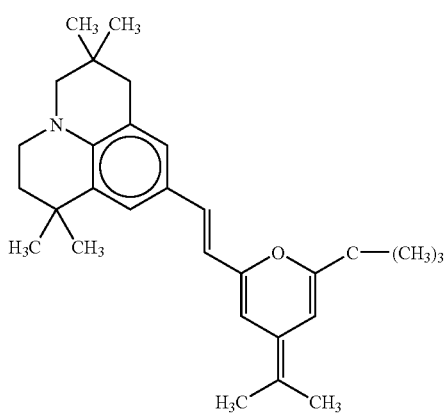

Preferably, a small amount (e.g., in a concentration less than about 200 parts per million) of a heavy metal, such as noble metals or rare earth metals, is provided in the red-emitting organic materials disclosed above to allow for more efficient transfer and harvest of the triplet-state energy of the blue-emitting material. Suitable heavy metals are Pd, Pt, Ru, Eu, and Ir.

Other suitable red-emitting materials are organometallic complexes, such as porphyrins, of divalent, trivalent, or tetravalent metals; for example, platinum, palladium, europium, or zinc. Examples are platinum porphyrins, such as platinum octaethylporphine. These compounds are disclosed in U.S. Pat. Nos. 6,048,630; 6,303,238; and 6,329,085, which are incorporated herein by reference. Other complexes are the maleonitriledithiolate phosphonate complexes of platinum, palladium, and zinc having peak emission between about 600 nm and 660 nm, as disclosed in U.S. Pat. No. 6,365,270, which is incorporated herein by reference. Some porphyrins without chelated metals also emit red light, such as those disclosed in U.S. Pat. No. 6,333,122, which is incorporated herein by reference.

Other suitable red-emitting organometallic complexes are the rare-earth metal complexes, such as derivatives of europium (III) phenanthroline (represented by europium (III) tris-thenoyltrifluoroacetone-1,10-phenanthroline, formula VIII), as disclosed by C. Adachi et al., "Electroluminescence Mechanisms in Organic Light-Emitting Devices Employing a Europium Chelate Doped in a Wide Band Gap Bipolar Conducting Host," J. Appl. Phys., Vol. 87, No. 11, 8049 (2000); and H. Heil et al., "Tris(dibenzoylmethane) (monophenanthroline)europium (III) Based Red Emitting Organic Light Emitting Diodes," J. Appl. Phys., Vol. 90, No. 10, 5357 (2001), which are incorporated herein by reference. Tris(dibenzoylmethane)(monophenanthroline)europium (III) is represented by formula IX below.

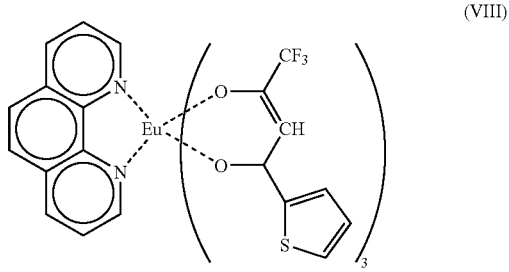

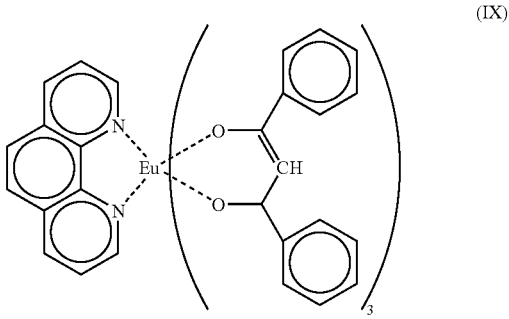

Another suitable red-emitting organometallic complex is bis{2-(2'-benzothienyl)-pyridinato-N-$C^{3'}$}(acetylacetonate) iridium (III) (formula X below) having a peak emission between 600 nm and 700 nm, as disclosed in Y. Kawamura, "Energy Transfer in Polymer Electrophosphorescent Light Emitting Devices With Single And Multiple Doped Luminescent Layers," J. Appl. Phys., Vol. 92, No. 1, 87 (2002), which is incorporated herein by reference.

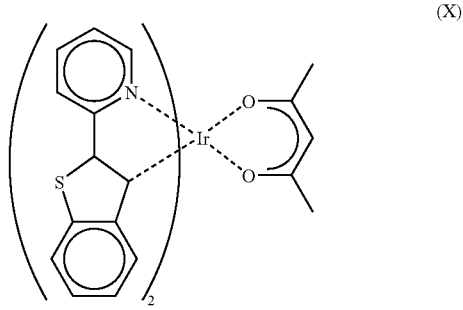

Another suitable red-emitting material is {2-(2'-benzothienyl)-pyridinato-N-$C^{3'}$}(acetylacetonate)platinum (II) (formula XI).

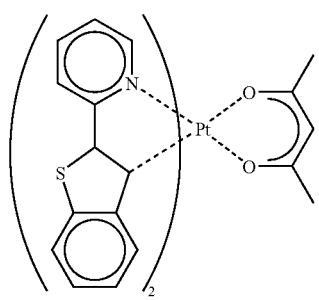

(XI)

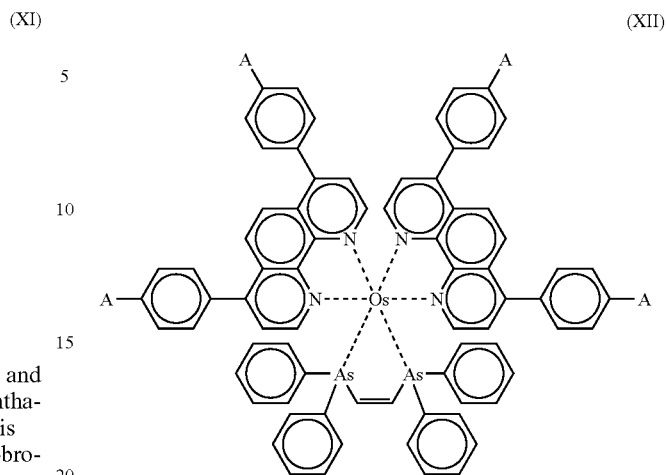

(XII)

Other suitable red-emitting materials are osmium (II) and ruthenium (II) complexes, such as bis(4,7-bis-(4-naphthalen-2-yl-phenyl)-1,10-phenanthroline)cis-1,2-vinylenebis (diphenylarsine)tosylate osmium (II) and bis(4,7-bis(p-bromophenyl)1-10-phenanthroline)cis-1,2-vinylenebis (diphenylarsine) osmium (II) (represented by formulas XII), polypyridyl ruthenium (II) complex (formula XIII), and tris(2,2'-bipyridyl) ruthenium (II) hexafluorophosphate (formula XIV).

where A is selected from the group consisting of Br⁻ and naphthyl radical.

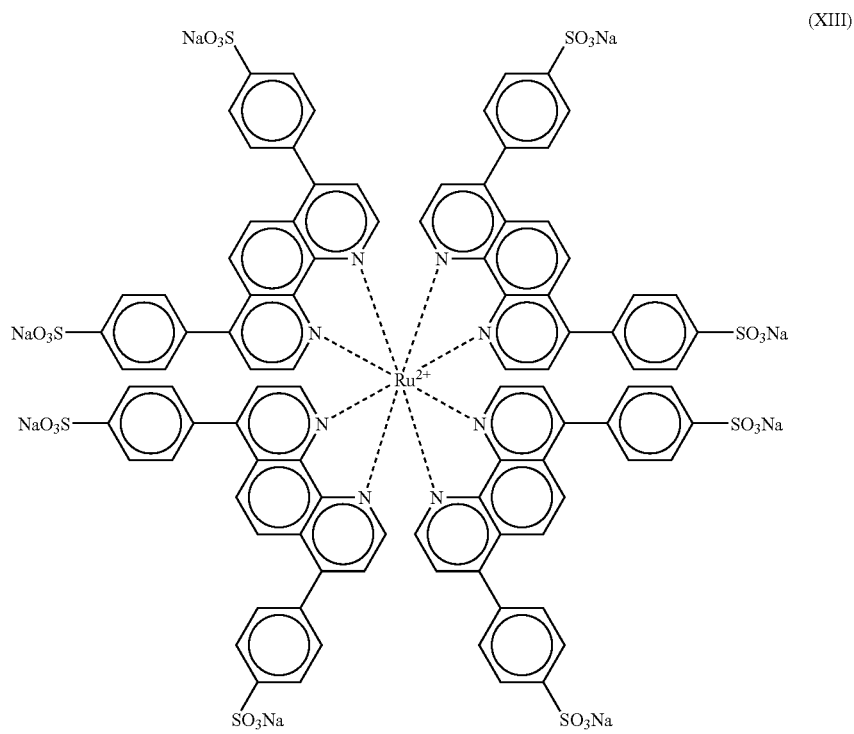

(XIII)

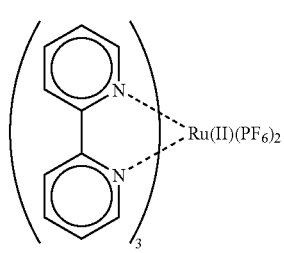

(XIV)

Figure 2:
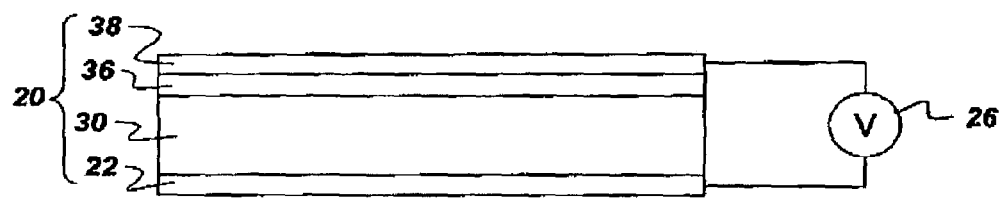
FIG. 2 shows schematically a light-emitting member including a hole injection enhancement layer.

Beside organic EL layer 30, one or more additional organic layers may be included in light-emitting member 20 to increase the efficiency of the overall device 10. For example, these additional layers can serve to improve the injection (electron or hole injection enhancement layers) or transport (electron or hole transport layers) of charges into the organic EL layer. The thickness of each of these layers is kept to below about 500 nm, preferably below about 100 nm. Materials for these additional layers are typically low-to-intermediate molecular weight (less than about 2000) organic molecules. They may be applied during the manufacture of the device 10 by conventional methods such as spray coating, dip coating, or physical or chemical vapor deposition. In one embodiment of the present invention, as shown in FIG. 2, a hole injection enhancement layer 36 is formed between the anode layer 38 and the organic EL layer 30 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803 incorporated herein by reference; such as 3,4,9,10-perylenetetra-carboxylic dianhydride or bis(1,2,5-thiadiazolo)-p-quinobis(1,3-dithiole).

Figure 3:
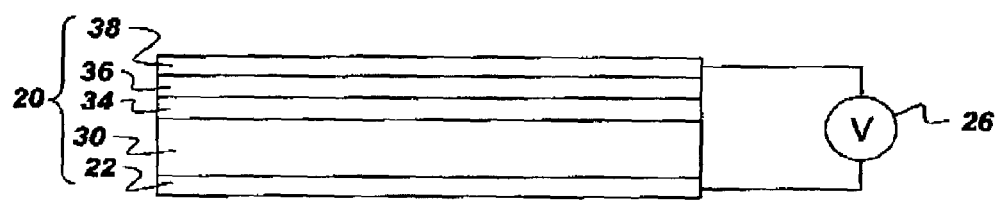
FIG. 3 shows schematically a light-emitting member including a hole injection enhancement layer and a hole transport layer.

In another embodiment of the present invention, as shown in FIG. 3, light-emitting member 20 further includes a hole transport layer 34 which is disposed between the hole injection enhancement layer 36 and the organic EL layer 30. The hole transport layer 34 has the functions of transporting holes and blocking the transportation of electrons so that holes and electrons are optionally combined in the organic EL layer 30. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371 incorporated herein by reference.

Figure 4:
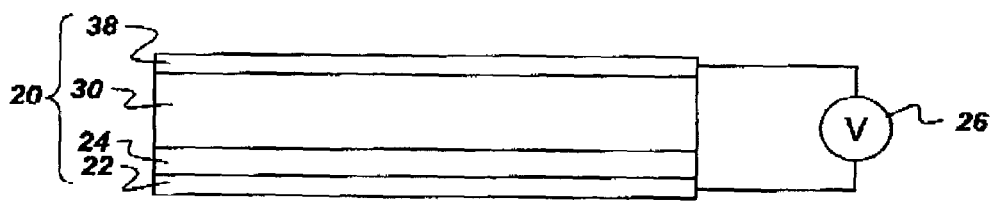
FIG. 4 shows schematically a light-emitting member including an electron injection enhancement and transport layer.

In still another embodiment of the present invention, as shown schematically in FIG. 4, light-emitting member 20 includes an additional layer 24 which is disposed between the cathode layer 22 and the organic EL layer 30. Layer 24 has the combined function of injecting and transporting electrons to the organic EL layer 30. Materials suitable for the electron injecting and transporting layer are metal organic complexes of 8-hydroxyquinoline, such as tris(8-quinolinolato)aluminum; stilbene derivatives; anthracene derivatives; perylene derivatives; metal thioxinoid compounds; oxadiazole derivatives and metal chelates; pyridine derivatives; pyrimidine derivatives; quinoline derivatives; quinoxaline derivatives; diphenylquinone derivatives; nitro-substituted fluorene derivatives; and triazines; as disclosed in U.S. Pat. Nos. 6,023,371 and 6,392,250, which are incorporated herein by reference.

Figure 5:
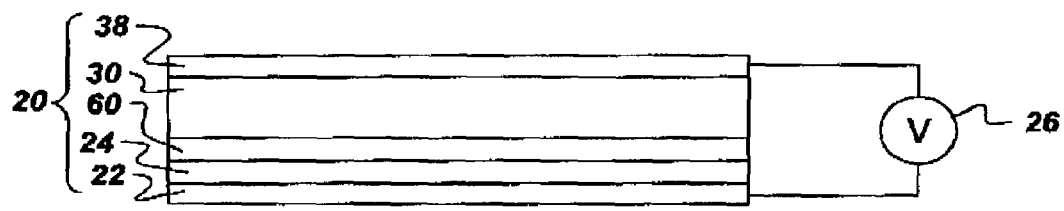
FIG. 5 shows schematically a light-emitting member including a hole blocking layer between the organic EL layer and the electron injection enhancement and transport layer.

In another embodiment of the present invention, as shown in FIG. 5, a hole blocking layer 26 is disposed between electron injecting and transporting layer 24 and EL layer 30. Hole blocking layer 60 serves to prevent holes from reaching cathode 22 where they are uselessly lost. Generally, electron transporting materials, such as those disclosed above, also have hole blocking property. In particular, suitable materials for hole blocking layer 60 are poly(N-vinyl carbazole), bathocurpoine ("BCP"), bis(2-methyl-8-quinolinato)triphenylsilanolate aluminum (III), bis(2-methyl-8-quinolinato)4-phenolate aluminum (III), and bis(2-methyl-8-quinolinato)4-phenylphenolate aluminum (III).

Figure 6:
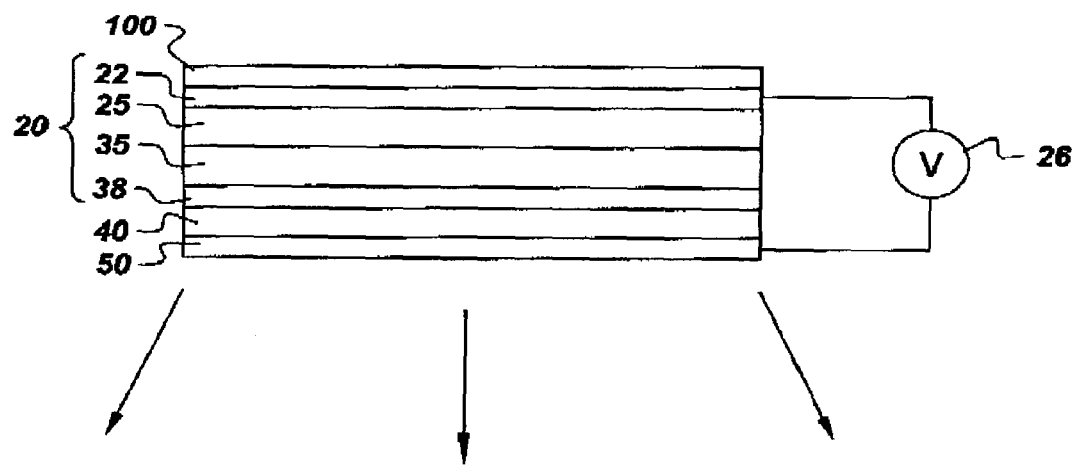
FIG. 6 shows schematically an embodiment wherein the light-emitting member comprises two separate organic EL layers.
Figure 7:
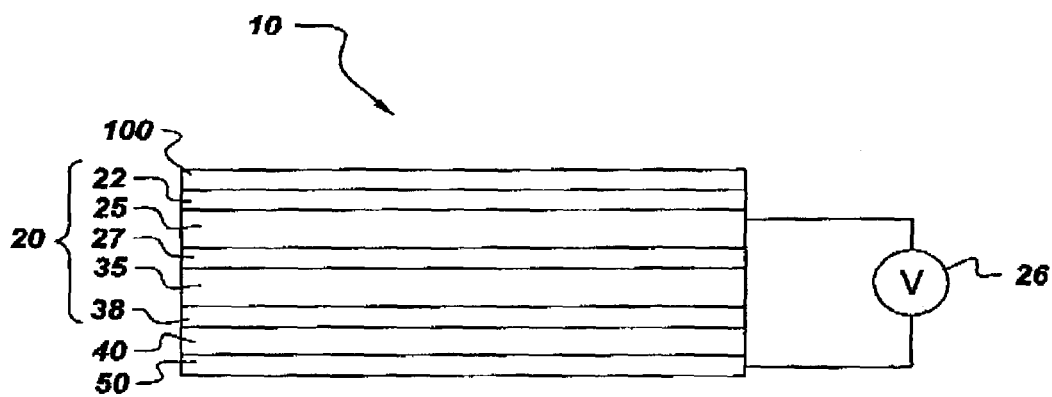
FIG. 7 shows schematically an embodiment wherein the light-emitting member comprises two separate organic EL layers and a charge blocking layer between the organic EL layers.
Figure 8:
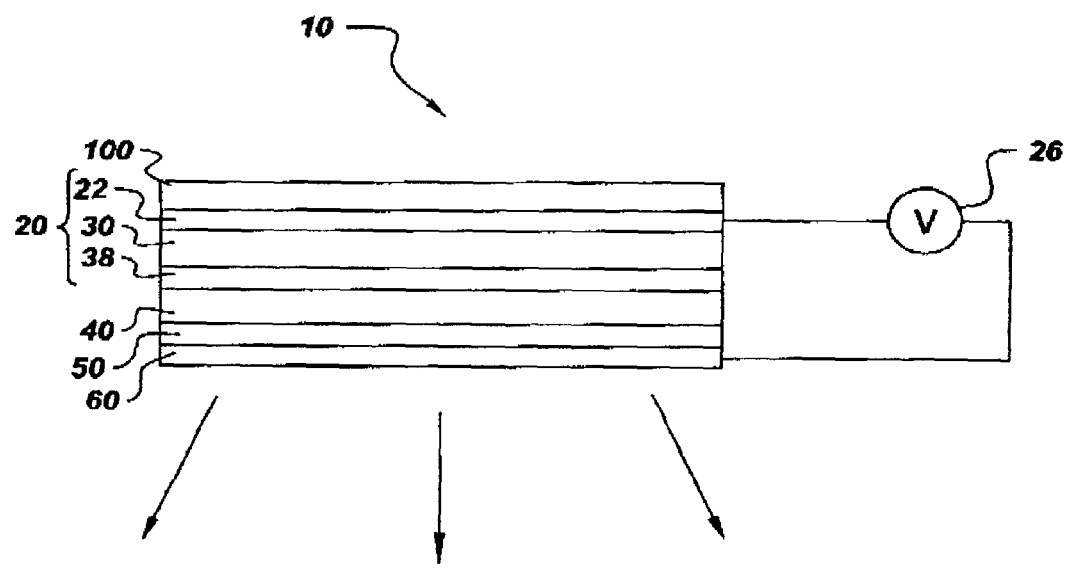
FIG. 8 shows schematically an embodiment comprising two separate layers of PL materials.

In another embodiment of the present invention, the blue and red light-emitting organic EL materials can be formed in separate layers 25 and 35, as shown in FIG. 6. Layer 25 disposed adjacent to cathode layer 22 can comprise blue- or red-emitting red material. The blue and red light-emitting organic EL materials can be advantageously mixed in a matrix material that is also an electron-transporting material selected from the group consisting of compounds disclosed above. Preferably, an intermediate spacer layer 27 is disposed between layers 25 and 35, as shown in FIG. 7. Intermediate spacer layer 27 serves to block the diffusion of singlet-state energy, and allows only the diffusion of triplet-state energy, from the blue-emitting layer to the red-emitting layer. In other words, the singlet-state energy of the blue-emitting material should be lower than that of the blue-emitting material, and the triplet-state energy of the blue-emitting material is higher than that that of the red-emitting material. When the red-emitting material is disposed closer to the cathode, the intermediate spacer layer should be a hole blocking layer wherein the mobility of electrons is greater than that of holes, the HOMO (highest occupied molecular orbital) energy of the spacer material should be less than that of the blue-emitting material, and the LUMO (lowest unoccupied molecular orbital) energy of the red-emitting should be greater than or equal to the LUMO energy of the spacer material and the blue-emitting material. Suitable hole blocking materials are disclosed above. On the other hand, when the red-emitting material is disposed closer to the anode, the intermediate spacer layer should be an electron blocking layer wherein the mobility of holes is greater than that of electrons, the LUMO energy of the spacer material should be higher than that of the blue-emitting material, and the HOMO energy of the re-emitting material should be less than or equal to the HOMO energy of the spacer material and the blue-emitting material. Generally, hole transport materials, such as those disclosed above, also have electron blocking property. In particular, suitable electron blocking materials are N,N'-diphenyl-N,N'-(3-methylphenyl)-1,1'-biphenyl-4,4'-diamine and poly(3-octyl-4-methylthiophene).

Intermediate spacer layer 27 can be formed by a method selected from the group consisting of physical vapor deposition, chemical vapor deposition, spin coating, spray coating, and dip coating.

The thickness of intermediate spacer layer 27 should be greater than the Förster energy-transfer radius for the couple of blue- and red-emitting materials. However, it should not be so great that the resistance to charge mobility is excessively increased. Typically, the thickness of intermediate spacer layer is from about 4 nm to about 20 nm.

The PL materials used in a device of the present invention are those absorbing a portion of shorter-wavelength light, preferably in the blue region, emitted by the organic EL material and emitting in the green region of the visible spectrum. Thus, the unabsorbed portion of the blue light and the red light emitted by the organic EL materials are mixed with the green light emitted by the PL material or materials to produce white light. The PL materials can be all organic, all inorganic, or a mixture of organic and inorganic phosphors. Organic PL materials typically have rigid molecular structure and are extended π-systems. They typically have small Stokes shifts and high quantum efficiency. For example, organic PL materials that exhibit absorption maxima in the blue portion of the spectrum exhibit emission in the green portion of the spectrum. Some non-limiting examples of suitable blue light-absorbing organic PL materials, which can be used in a device of the present invention, are azo dyes, anthraquinone dyes, nitrodipheylamine dyes, iron (II) complexes of 1-nitroso-2-naphthol and 6-sulphol-1-nitroso-2-naphthol, as disclosed in P. F. Gordon and P. Gregory, "Organic Chemistry in Colour," Springer-Verlag, Berlin pp. 99–101, 105–106, 126, 180, 253–255, and 257 (1983). Other organic PL materials are coumarin and xanthene dyes.

The organic PL materials may be deposited on the substantially transparent electrode 38 of the light-emitting member 20 by physical vapor deposition, spraying, spin coating, dip coating, or printing such as ink-jet printing. They also may be dispersed in a substantially transparent polymeric material such as polyacrylates, polycarbonates, PET, polyesters, polysulfones, polyetherimides, silicone, epoxy, or derivatives thereof. Then, the mixture is formed by casting into a film 50 that is subsequently disposed on the light-emitting member 20.

In another embodiment of the present invention, an inorganic PL material is used in place of, or in addition to, the organic PL material in film 50. The inorganic PL material can even be dispersed in a separate matrix and a film 60 is formed and disposed on light-emitting member 20 adjacent to film 50. The particle size and the interaction between the surface of the particle and the polymeric medium determine how well particles are dispersed in polymeric materials to form the film or layer 60. Many micrometer-sized particles of inorganic phosphor materials disperse well in standard silicone polymers, such as poly(dimethylsiloxanes) by simple stirring. If necessary, other dispersant materials (such as a surfactant or a polymeric material like poly(vinyl alcohol)) may be added such as are used to suspend many standard phosphors in solution. The phosphor particles may be prepared from larger pieces of phosphor material by any grinding or pulverization method, such as ball milling using zirconia-toughened balls or jet milling. They also may be prepared by crystal growth from solution, and their size may be controlled by terminating the crystal growth at an appropriate time.

Non-limiting examples of suitable blue light-absorbing and green light-emitting inorganic PL materials are $Ca_8Mg(SiO_4)_4Cl_2:Eu^{2+},Mn^{2+}$; $GdBO_3:Ce^{3+}, Tb^{3+}$; $CeMgAl_{11}O_{19}:Tb^{3+}$; $Y_2SiO_5:Ce^{3+},Tb^{3+}$; $BaMg_2Al_{16}O_{27}:Eu^{2+},Mn^{2+}$; $(Ca,Sr)S:Ce$; $Sr_2Si_3O_8 \cdot 2SrCl_2:Eu^{2+}$; $Sr_4Al_{14}O_{25}:Eu^{2+}$; $Y(Gd,Tb,Lu)_3(Al,Ga)_5O_{12}:Ce^{3+}$; and Mn-doped magnesium fluorogermanate.

Still other ions may be incorporated into the phosphor to transfer energy from the light emitted from the organic material to other activator ions in the phosphor host lattice as a way to increase the energy utilization. For example, when $Sb^{2+}$ and $Mn^{2+}$ ions exist in the same phosphor lattice, $Sb^{3+}$ efficiently absorbs light in the blue region, which is not absorbed very efficiently by $Mn^{2+}$, and transfers the energy to $Mn^{2+}$ ion. Thus, a larger total amount of light emitted by the organic EL material is absorbed by both ions, resulting in higher quantum efficiency of the total device.

The phosphor particles are dispersed in a film-forming polymeric material, such as polyacrylates, substantially transparent silicone or epoxy. A phosphor composition of less than about 30, preferably less than about 10, percent by volume of the mixture of polymeric material and phosphor is used. A solvent may be used into the mixture to adjust the viscosity of the film-forming material to a desired level. The mixture of the film-forming material and phosphor particles is formed into a layer by spray coating, dip coating, printing, or casting on a substrate. Thereafter, the film is removed from the substrate and disposed on the light-emitting member 20. The thickness of each of films or layers 50 and 60 is preferably less than 1 mm, more preferably less than 500 µm. Preferably, the film-forming polymeric materials have refractive indices close to those of the substrate 40 and the organic EL material; i.e., in the range from about 1.4 to 1.6.

A light-emitting device of the present invention can advantageously be encapsulated in a protective barrier, as taught in copending patent application Ser. No. 09/683,345, entitled "Light-Emitting Device With Organic Electroluminescent Material And Photoluminescent Materials," filed on Dec. 17, 2001, assigned to the common assignee. This patent application is incorporated herein by reference.

A method of making a light-emitting device is now described. A substrate such as a large-area piece of glass or plastic is first provided. A first electrically conducting material is deposited on one surface of the substrate to form a first electrode. The first electrode may be an anode or a cathode, and one or more appropriate materials are chosen among those disclosed earlier for the electrodes. The first electrode material preferably sputter-deposited on the substrate. Furthermore, the first electrode may be patterned to a desired configuration by, for example, etching.

In one embodiment, at least two organic EL materials are used that emit in two different wavelength ranges are mixed together, and the mixture is deposited in a layer on the first electrode by physical or chemical vapor deposition, spin coating, dip coating, spraying, ink-jet printing, or casting, followed by polymerization, if necessary, or curing of the materials. The mixture of organic EL materials may be diluted in a solvent to adjust its viscosity or mixed with another polymeric material that serves as a film-forming vehicle. An electron transporting material selected from among those disclosed above can also be added into the mixture with or without the film-forming polymer. A second electrically conducting material is deposited on the organic EL layer to form a second electrode. The second electrode may be deposited on the entire area of the organic EL material or patterned into a desired shape or configuration. At least one of the electrodes is substantially transparent. The electrodes and the organic EL layer comprise a light-emitting member. At least one organic PL material is disposed adjacent to the light-emitting member to receive EM radiation emitted therefrom. An organic PL material may be deposited on a surface of the light-emitting member, for example by physical or chemical vapor deposition, spraying, spin coating, dip coating, or ink-jet printing. Alternatively, the organic PL material is dispersed in a substantially transparent polymeric material, such as polyacrylates, polycarbonates, PET, polyesters, polyetherimides, polysulfones, silicone, or epoxy, and the mixture is deposited on a surface of the light-emitting member in the form of a layer or film by physical or chemical vapor deposition, spin coating, dip coating, spraying, or ink-jet printing. The organic PL material is preferably deposited, or a film containing it is preferably formed, on the same side of the light-emitting member as the transparent electrode.

Alternatively, the mixture may be cast into a film separately, and the film is attached to a surface of the light-emitting member. The method can include the optional step of forming one or more additional layers serving as hole injection enhancement layer, hole transport layer, and electron injection enhancement and transport between an electrode and the layer of organic EL material.

In another embodiment, subsets of layers necessary or desired for the operation of an organic light-emitting device are formed in separate assemblies, and the assemblies are laminated or attached together to produce a working device.

In still another embodiment of the present invention, the method comprises disposing an inorganic PL material adjacent to the light-emitting member. The inorganic PL material is preferably disposed on the same side of the light-emitting member as the transparent electrode. The inorganic PL material is dispersed in a substantially transparent polymeric material, such as those disclosed above, and the mixture is deposited on the film or layer of organic PL material (when both organic and inorganic PL materials are desired) or on the substrate (when only the inorganic PL material is desired) by spin coating, dip coating, spraying, or ink-jet printing. Alternatively, the mixture may be cast into a film separately, and the film is attached to the layer of the organic PL material or to the substrate. It is understood that the order of PL layers may be reversed when both organic and inorganic PL materials are desired; i.e., the inorganic PL layer may be first attached to the light-emitting member, and the organic PL layer is attached on the inorganic PL layer.

In an embodiment wherein the organic EL materials are desired to be disposed in separate layers or films, each can be formed into a layer or deposited as the neat material or a mixture of the material with a film-forming material, as disclosed above. Preferably, the film-forming material is an electron transporting material to facilitate electron transport through organic EL layers.

EXAMPLES OF LIGHT-EMITTING MEMBERS

A light-emitting member that incorporates the concept of the triplet-state energy transfer of the present invention comprises the following components disposed in the order: an anode, a layer of polyfluorene blue-emitting material, a spacer layer of poly(2,5-pyridinediyl), a layer of red-emitting tris(dinapthoylmethane) monophenanthroline europium (III) ("Dnm:Eu", formula XV), and a cathode. This light-emitting member would have appropriately matched HOMO and LUMO energy levels among the adjacent layers to provide an efficient device.

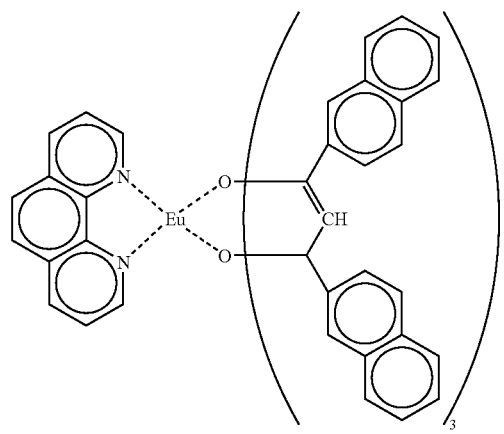

(XV)

Another light-emitting member can be envisioned to comprise the following layers disposed in the order: an anode, a layer of red-emitting material comprising polyfluorene doped with Dnm:Eu or platinum octaethylporphine, a spacer layer of poly(3-octyl-4-methylthiophene), a layer of blue-emitting polyfluorene, and a cathode.

Figure 9:
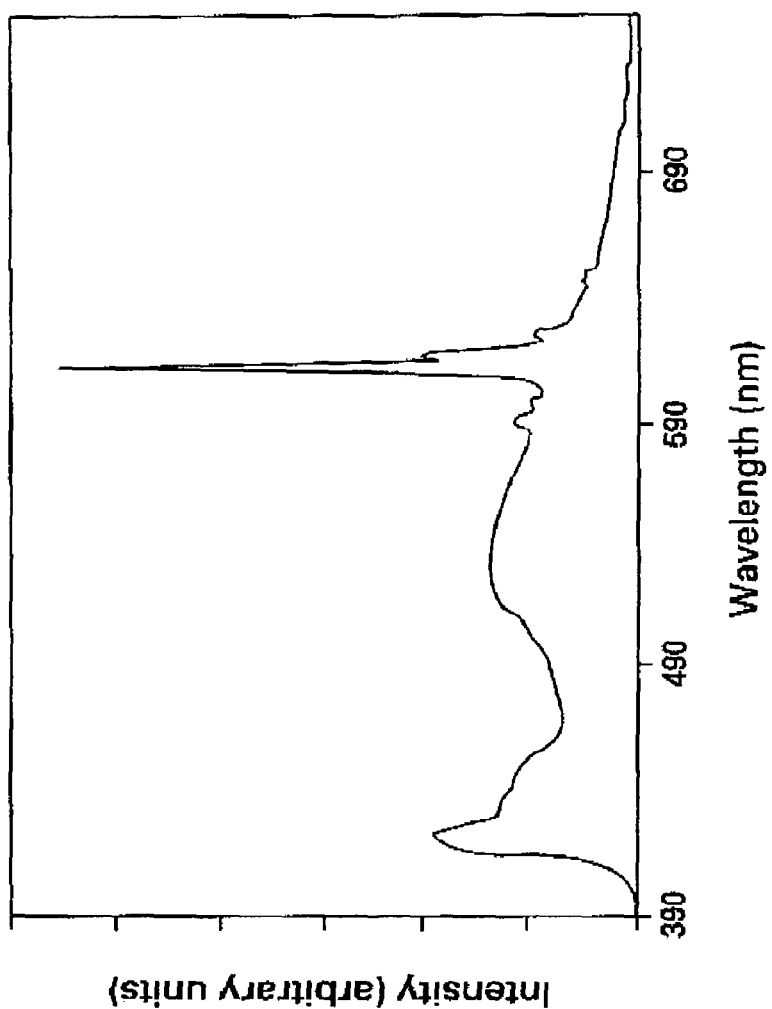
FIG. 9 shows the composite emission spectrum of a device comprising blue-emitting polyfluorene, red-emitting tris(dinapthoylmethane)-mono(phenanthroline) europium (III), and a cerium-doped yttrium aluminate garnet phosphor.

A white light-emitting device of the present invention is simulated using the blue-emitting polyfluorene, the red-emitting Dnm:Eu, and a green-yellow emitting $(Y,Gd)_3Al_5O_{12}:Ce^{3+}$ phosphor. The emission spectrum of such a device is shown in FIG. 9. This device would have a color rendering index of 90, a correlated color temperature of 4980 K, and a coordinate of (x=0.3456, y=0.3523) on the CIE (Commission Internationale de l'Eclairage) chromaticity diagram. This coordinate is close to the black body locus.

Large-area light-emitting devices may be produced by laminating together a large-area light-emitting member already formed on a large-area piece of plastic or glass substrate and at least one film comprising at least one organic PL material. By "large area" it is meant that the light-emitting surface area is at least equal to that of a 10 cm×10 cm square. Additional films, each comprising at least one inorganic PL material or light-scattering material may also be laminated at the same time. Furthermore, protective barrier films may be formed separately and then laminated together with the light-emitting member and other films.

Large-area light-emitting devices of the present invention are advantageously used to provide illumination of large areas, such as for general illumination purposes.

Several light-emitting devices of the present invention may be disposed on a support to display desired messages or signs.

While specific preferred embodiments of the present invention have been disclosed in the foregoing, it will be appreciated by those skilled in the art that many modifications, substitutions, or variations may be made thereto without departing from the spirit and scope of the invention as defined in the appended claims.

What is claimed is:

1. A light-emitting device comprising a light-emitting member that comprises a first electrode, a second electrode, at least two organic electroluminescent ("EL") materials disposed between said first and second electrodes, and a charge blocking material disposed between said at least two organic EL materials, said light-emitting member emitting first electromagnetic ("EM") radiation having a first spectrum when an electrical voltage is applied across said electrodes; and at least one photoluminescent ("PL") material disposed in a path of light emitted by said light-emitting member, said PL material absorbing a portion of said first EM radiation and emitting second EM radiation having a second spectrum.

2. The light-emitting device according to claim 1, wherein each of said at least two organic EL materials emits EM radiation in one of two different wavelength ranges.

3. The light-emitting device according to claim 2, wherein said two different wavelength ranges are blue and red EM radiation ranges.

4. The light-emitting device according to claim 3, wherein said blue EM radiation has a wavelength range from about 380 nm to about 500 nm, and said red EM radiation has a wavelength range from about 600 nm to about 770 nm.

5. The light-emitting device according to claim 1, wherein said second spectrum is in a green EM radiation wavelength range.

6. The light-emitting device according to claim 5, wherein said green EM radiation wavelength range is from about 500 nm to about 600 nm.

7. The light-emitting device according to claim 1, wherein said PL material is dispersed in a layer of a polymeric material, said layer being disposed on said light-emitting member.

8. The light-emitting device according to claim 1, wherein said PL material comprises an organic PL material and an inorganic PL material.

9. The light-emitting device according to claim 1, wherein each of said organic PL material and said inorganic PL material is disposed in a different layer.

10. The light-emitting device according to claim 1, wherein at least a first organic EL material is selected from the group consisting of poly(N-vinylcarbazole); poly(alkylfluorene); poly(paraphenylene); polysilanes; derivatives of poly(N-vinylcarbazole); derivatives of poly(alkylfluorene); derivatives of poly(paraphenylene); derivatives of polysilanes; mixtures comprising at least two of poly(N-vinylcarbazole), poly(alkylfluorene), poly(paraphenylene), and polysilanes; copolymers comprising structural units found in at least two of poly(N-vinylcarbazole), poly(alkylfluorene), poly(paraphenylene), and polysilanes; 1,3,5-tris{n-(4-diphenylaminophenyl) phenylamino} benzene; phenylanthracene; tetraarylethene; coumarin; rubrene; tetraphenylbutadiene; anthracene; perylene; coronene; aluminum-(picolymethylketone)-bis[2,6-di(t-butyl)phenoxides; scandium-(4-methoxypicolymethylketone)-bis(acetylacetonate); aluminum-acetylacetonate; gallium-acetylacetonate; and indium-acetylacetonate; and at least a second organic EL material is selected from the group consisting of alkoxy-substituted poly(paraphenylene); triphenylene hexaethers; perylene tetraesters; derivatives of azlactone; dibenzotetraphenylperiflanthene; derivatives of pentacene; derivatives of quinoline; derivatives of pyran; porphyrin complexes of platinum, palladium, europium, and zinc; derivatives of europium (III) phenanthroline; maleonitriledithiolate phosphonate complexes of platinum, palladium, and zinc; acetoacetonate complexes of iridium (III) and platinum (II); and polypyridyl complexes of osmium (II) and ruthenium (II).

11. The light-emitting device according to claim 1, wherein at least a first organic EL material is selected from the group consisting of poly(N-vinylcarbazole); poly(alkylfluorene); poly(paraphenylene); polysilanes; derivatives of poly(N-vinylcarbazole); derivatives of poly(alkylfluorene); derivatives of poly(paraphenylene); derivatives of polysilanes; mixtures comprising at least two of poly(N-vinylcarbazole), poly(alkylfluorene), poly(paraphenylene), and polysilanes; copolymers comprising structural units found in at least two of poly(N-vinylcarbazole), poly(alkylfluorene), poly(paraphenylene), and polysilanes; 1,3,5-tris{n-(4-diphenylaminophenyl) phenylamino} benzene; phenylanthracene; tetraarylethene; coumarin; rubrene; tetraphenylbutadiene; anthracene; perylene; coronene; aluminum-(picolymethylketone)-bis[2,6-di(t-butyl)phenoxides; scandium-(4-methoxypicolymethylketone)-bis(acetylacetonate); aluminum-acetylacetonate; gallium-acetylacetonate; and indium-acetylacetonate; and wherein at least a second organic EL material comprises a material selected from the group consisting of alkoxy-substituted poly(paraphenylene); triphenylene hexaethers; perylene tetraesters; derivatives of azlactone; dibenzotetraphenylperiflanthene; derivatives of pentacene; derivatives of quinoline; and derivatives of pyran; and wherein said at least a second organic material further comprises at least a metal selected from the group consisting of palladium, platinum, ruthenium, europium and iridium.

12. The light-emitting device according to claim 10, wherein:
said alkoxy-substituted poly(paraphenylene) is poly{2-methoxy-5(2-ethyl-hexyloxy)-1,4-phenylene-1,2 ethenylene-2,5-dimethoxy-1,4-phenylene-1,2-ethenylene};

one of said triphenylene hexaethers is represented by

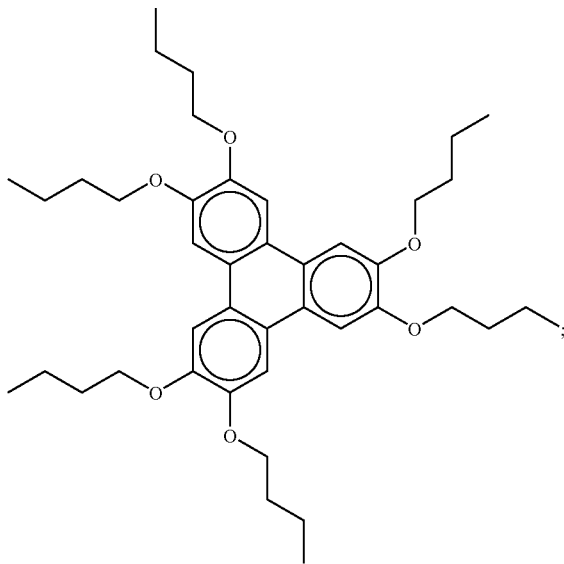

(I)

one of said perylene tetraesters is represented by

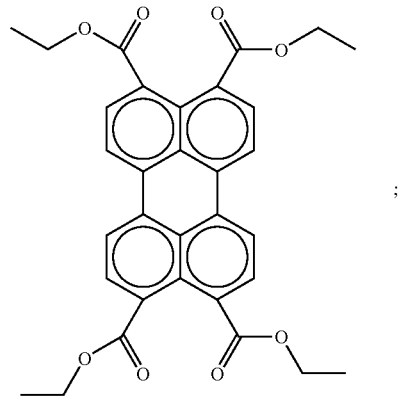

(II)

one of said derivatives of azlactone is represented by

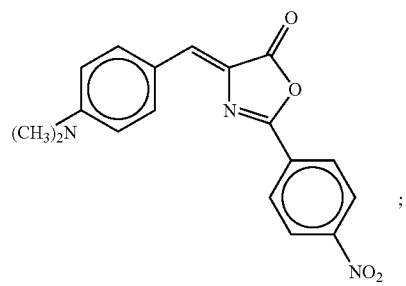

(III)

one of said derivatives of pentacene is represented by

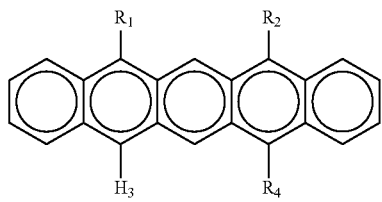
(IV)

wherein each of $R_1$, $R_2$, $R_3$, and $R_4$ is independently selected from the group consisting of aromatic, substituted aromatic, heteroaromatic, or substituted heteroaromatic groups;

one of said derivatives quinoline is represented by

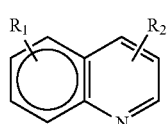
(V)

wherein $R_1$ and $R_2$ are independently represented by

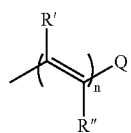
(VI)

wherein R' an R" are independently selected from the group consisting of alkylaryl, alkenylaryl, and heteroaryl groups; Q is a radical selected from aryl group and fused ring aromatic groups; and n is from 1 to 3, inclusive;

one of said derivatives of pyran is represented by

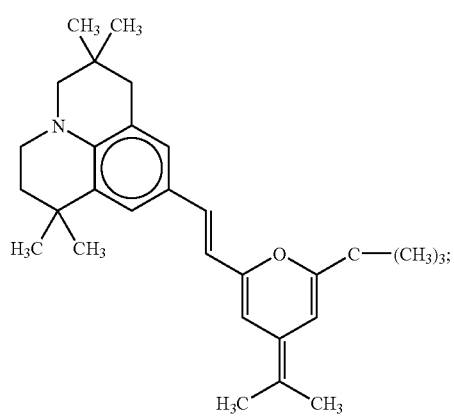
(VII)

said porphyrin complexes of platinum is represented by platinum octaethylporphine; said derivatives of europium (III) phenanthroline are selected from the group consisting of:

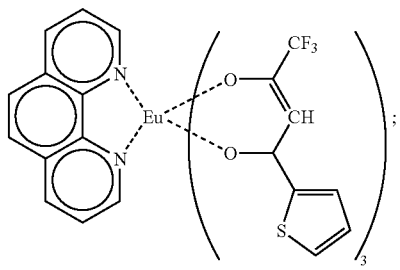
(VIII)

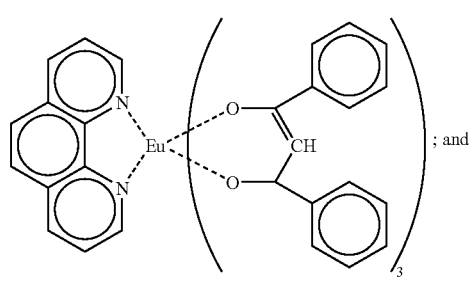
(IX)

; and

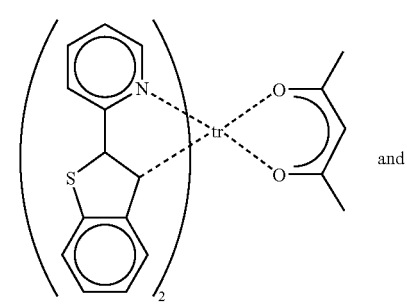
(XV)

said maleonitriledithiolate phosphonates complexes are selected from the group consisting of platinum(bis (diphenylphosphino)methane)maleonitriledithiolate and platinum(bis(triphenylphosphino)maleonitrilethiolate;

said acetoacetonate complexes of iridium (III) and Pt(II) have the formula (X)

and

-continued
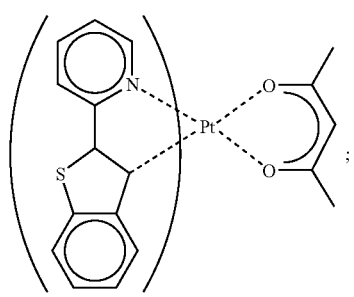
(XI)
said polypyridyl complexes of osmium (II) and ruthenium (II) are selected from the group consisting of:
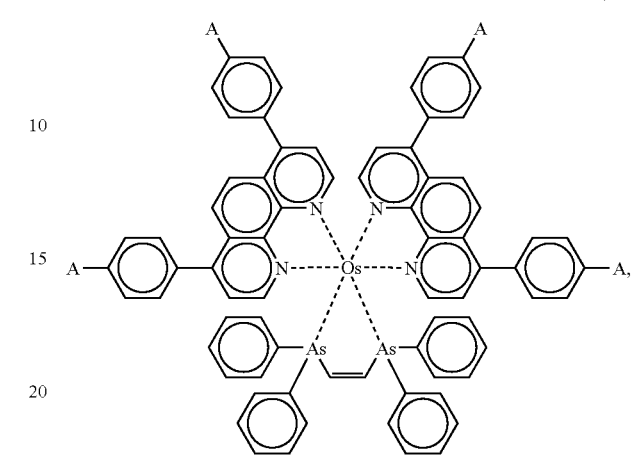
(XII)
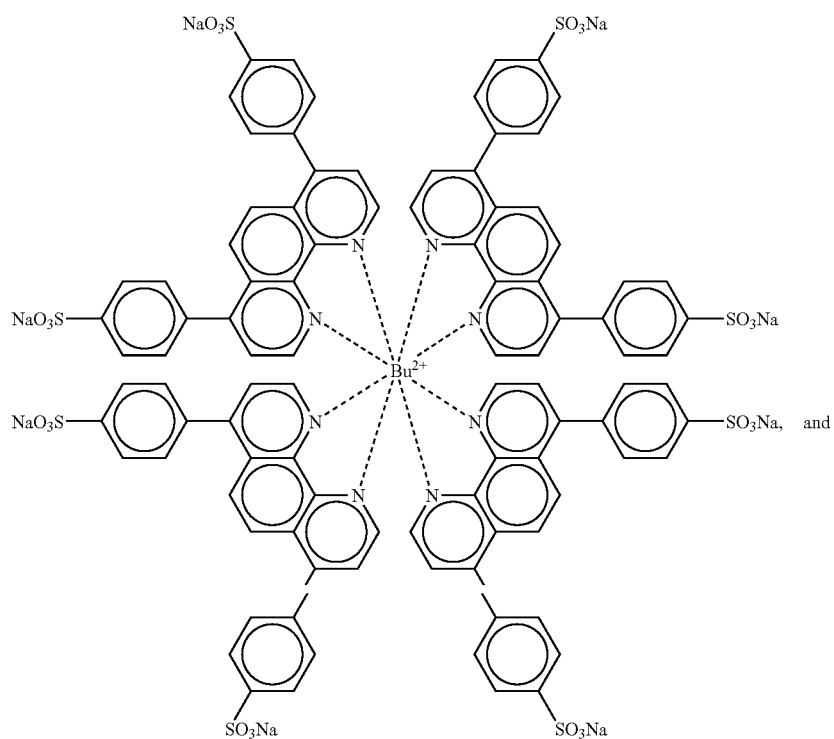
(XIII)
and
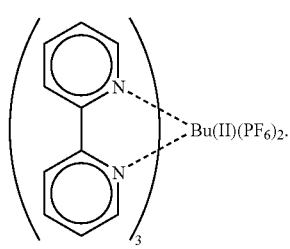
(XIV)

13. The light-emitting device according to claim 1, wherein said PL material is selected from the group consisting of azo dyes, anthraquinone dyes, nitrodiphenylamine dyes, iron (II) complexes of 1-nitroso-2-naphthol and 6-sulphol-1-nitroso-2-naphthol, coumarin dyes, and xanthene dyes.

14. The light-emitting device according to claim 1, wherein said PL material is selected from the group consisting of $Ca_8Mg(SiO_4)_4Cl_2:Eu^{2+},Mn^{2+}$; $GdBO_3:Ce^{3+}$, $Tb^{3+}$; $CeMgAl_{11}O_{19}:Tb^{2+}$; $Y_2SiO_5:Ce^{3+},Tb^{3+}$; and $BaMg_2Al_{16}O_{27}:Eu^{2+},Mn^{2+}$; $(Ca,Sr)S:Ce$; $Sr_2Si_3O_8.2SrCl_2$: $Eu^{2+}$; $Sr_4Al_{14}O_{25}:Eu^{2+}$; $Y(Gd,Tb,Lu)_3(Al,Ga)_5O_{12}:Ce^{3+}$; and Mn-doped magnesium fluorogermanate.

15. The light-emitting device according to claim 1, wherein said organic EL materials are dispersed in a matrix of at least an electron-transporting material.

16. The light-emitting device according to claim 15, wherein said electron-transporting material is selected from the group consisting of metal organic complexes of 8-hydroxyquinoline; stilbene derivatives; anthracene derivatives; perylene derivatives; metal thioxinoid compounds; oxadiazole derivatives and metal chelates; pyridine derivatives; pyrimidine derivatives; quinoline derivatives; quinoxaline derivatives; diphenylquinone derivatives; nitro-substituted fluorene derivatives; and triazines.

17. The light-emitting device according to claim 1, further comprising an electron injection enhancement layer that comprises an electron-transporting material and is disposed between a cathode and a layer of at least one of said organic EL materials.

18. The light-emitting device according to claim 17, wherein said electron-transporting material is selected from the group consisting of metal organic complexes of 8-hydroxyquinoline; stilbene derivatives; anthracene derivatives; perylene derivatives; metal thioxinoid compounds; oxadiazole derivatives and metal chelates; pyridine derivatives; pyrimidine derivatives; quinoline derivatives; quinoxaline derivatives; diphenylquinone derivatives; nitro-substituted fluorene derivatives; and triazines.

19. The light-emitting device according to claim 1, further comprising a layer of a hole transport material, which layer is disposed between an anode and a layer of at least one of said organic EL materials.

20. The light-emitting device according to claim 19, wherein said hole transport material is selected from the group consisting of triaryldiamine, tetraphenyldiamine, aromatic tertiary amines, hydrazone derivatives, carbazole derivatives, triazole derivatives, imidazole derivatives, oxadiazole derivatives having an amino group, and polythiophenes.

21. The light-emitting device according to claim 1, wherein said first electrode comprises a material selected from the group consisting of K, Li, Na, Mg, La, Ce, Ca, Sr, Ba, Al, Ag, In, Sn, Zn, Zr, Sm, Eu, alloys thereof, and mixtures thereof.

22. The light-emitting device according to claim 1, wherein said second electrode comprises a materials elected from the group consisting of ITO, tin oxide, indium oxide, zinc oxide, indium zinc oxide, zinc indium tin oxide, antimony oxide, and mixtures thereof.

23. The light-emitting device according to claim 1, further comprising an encapsulating protective barrier.

24. A light-emitting device comprising:
a light-emitting member that comprises a first electrode, a second electrode, at least two organic EL materials disposed in separate layers between said first and second electrodes, and a charge blocking layer disposed between said layers of said organic EL materials, and light-emitting member emitting first EM radiation having a first spectrum when an electrical voltage is applied across said electrodes, wherein at least a first organic EL materials emits EM radiation having a first wavelength range from about 380 nm to about 500 nm, and a second organic EL material emits EM radiation having a second wavelength range from about 600 nm to about 770 nm; and at least one PL material disposed in a path of light emitted by said light-emitting member, said PL material absorbing a portion of said first EM radiation and emitting second EM radiation having a second spectrum having a third wavelength range from about 500 nm to about 600 nm.

25. The light-emitting device according to claim 24, wherein each of said at least two organic PL materials emits EM radiation having a wavelength range selected from the group consisting of said first wavelength range and said second wavelength range.

26. A light-emitting device comprising:
a light-emitting member that comprises a first electrode, a second electrode, at least two organic EL materials disposed in separate layers between said first and second electrodes, and a charge blocking layer disposed between said layers of said organic PL materials, said light-emitting member being disposed on a substrate and emitting first EM radiation having a first spectrum when an electrical voltage is applied across said electrodes; and at least one PL material disposed in a path of light emitted by said light-emitting member, said PL material absorbing a portion of said first EM radiation and emitting second EM radiation having a second spectrum having a wavelength range from about 500 nm to about 600 nm;

wherein at least a first organic EL material is selected from the group consisting of poly(N-vinylcarbazole); poly(alkylfluorene); poly(paraphenylene); polysilanes; derivatives of poly(N-vinylcarbazole); derivatives of poly(alkylfluorene); derivatives of poly(paraphenylene); derivatives of polysilanes; mixtures comprising at least two of poly(N-vinylcarbazole), poly(alkylfluorene), poly(paraphenylene), and polysilanes; copolymers comprising structural units found in at least two of poly(N-vinylcarbazole), poly(alkylfluorene), poly(paraphenylene), and polysilanes; 1,3,5-tris{n-(4-diphenylaminophenyl) phenylamino} benzene; phenylanthracene; tetraarylethene; coumarin; rubrene; tetraphenylbutadiene; anthracene; perylene; coronene; aluminum-(picolymethylketone)-bis[2,6-di(t-butyl) phenoxides; scandium-(4-methoxypicolymethylketone)-bis(acetylacetonate); aluminum-acetylacetonate; gallium-acetylacetonate; and indium-acetylacetonate; and at least a second organic EL material is selected from the group consisting of

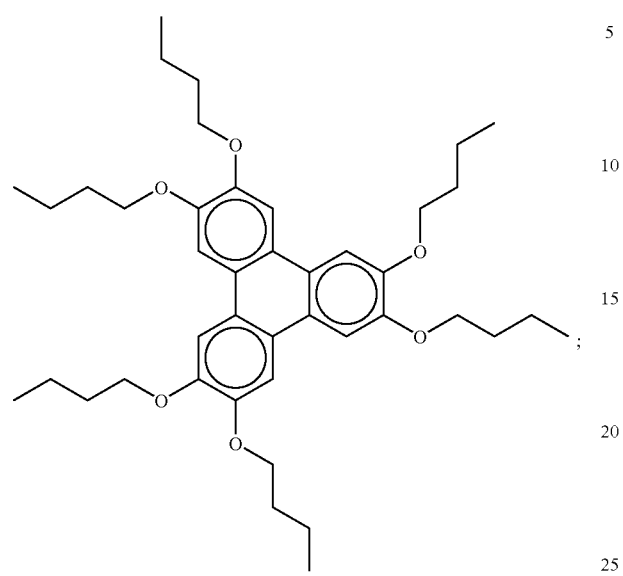
(I)

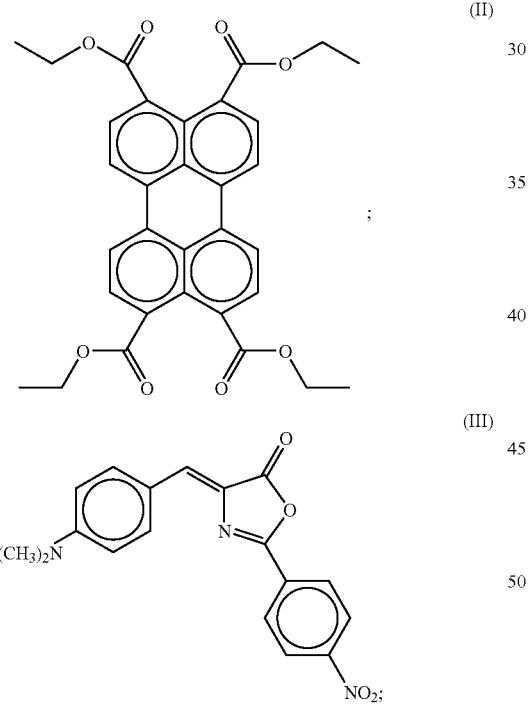
(II)

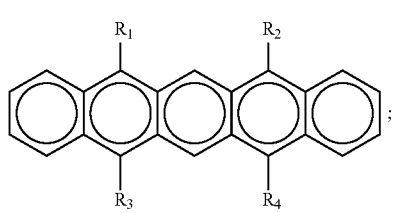
(III)

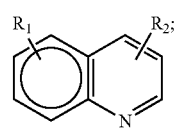
(IV)

wherein each of R₁, R₂, R₃, and R₄ is independently selected from the group consisting of aromatic, substituted aromatic, heteroaromatic, or substituted heteroaromatic groups;

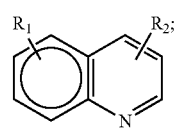
(V)

wherein R₁ and R₂ are independently represented by

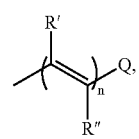
(VI)

wherein R' an R" are independently selected from the group consisting of alkylaryl, alkenylaryl, and heteroaryl groups; Q is a radical selected from aryl group and fused ring aromatic groups; and n is from 1 to 3, inclusive;

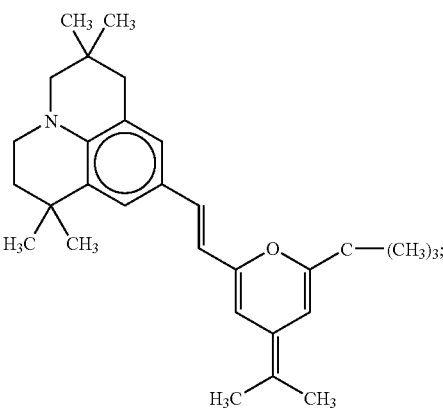
(VII)

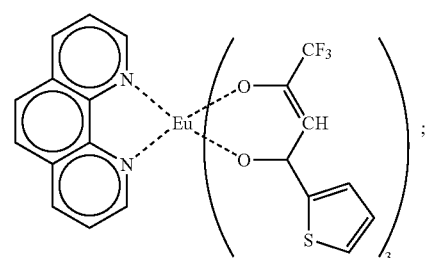
(VIII)

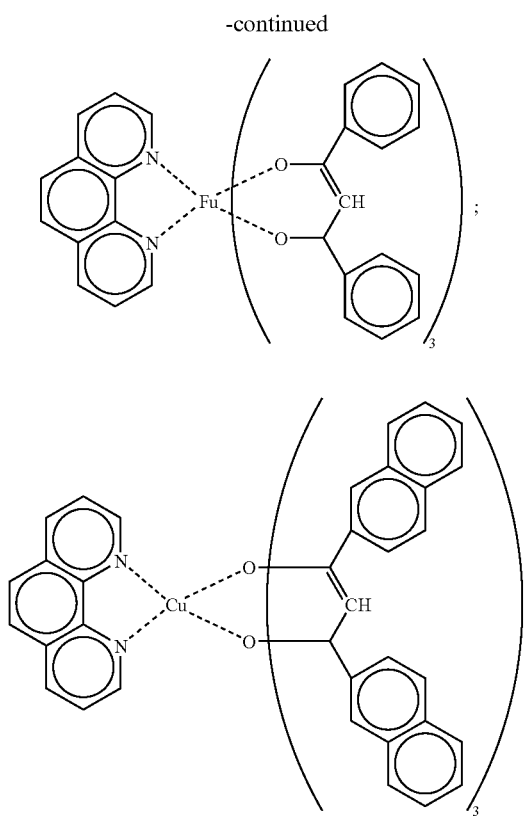
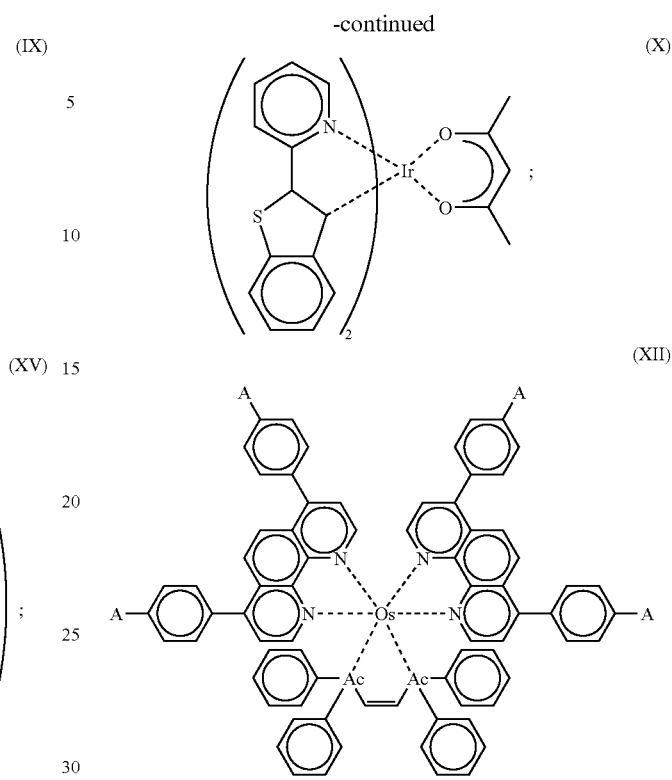
where A is selected from the group consisting of Br⁻ and naphthyl radical;
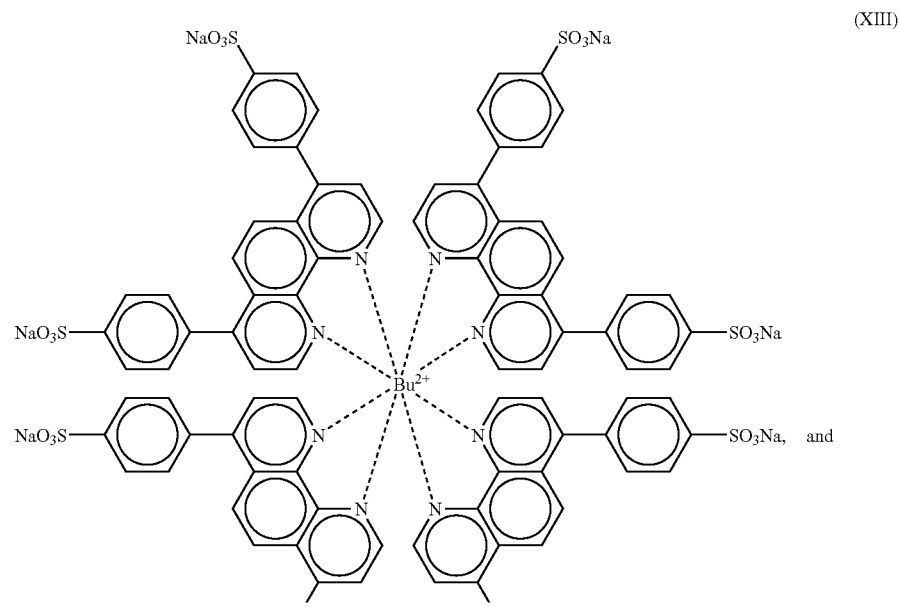
and

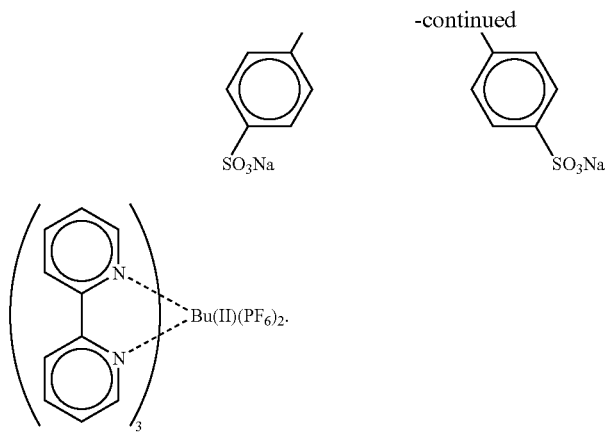

(XIV)

said PL material is selected from the group consisting of organic PL materials and inorganic PL material; said organic PL materials are selected from the group consisting of azo dyes, anthraquinone dyes, nitrodiphenylamine dyes, iron (II) complexes of 1-nitroso-2-naphthol and 6-sulphol-1-nitroso-2-naphthol, coumarin dyes, and xanthene dyes;

said inorganic PL materials are selected from the group consisting of $Ca_8Mg(SiO_4)_4Cl_2:Eu^{2+},Mn^{2+}$; $GdBO_3:Ce^{3+}$, $Tb^{3+}$; $CeMgAl_{11}O_{19}:Tb^{3+}$; $Y_2SiO_5:Ce^{3+},Tb^{3+}$; and $BaMg_2Al_{16}O_{27}:E^{2+},Mn^{2+}$; $(Ca,Sr)S:Ce$; $Sr_2Si_3O_8 \cdot 2SrCl_2:Eu^{2+}$; $Sr_4Al_{11}O_{25}:Eu^{2+}$; $Y(Cd,Tb,Lu,)_3(Al,Ga)_5O_{12}:Ce^{3+}$, and Mn-doped magnesium fluorogermanate; and said charge blocking layer comprises a material selected from the group consisting of poly(N-vinyl carbazole), bathocuproine ("BCP"), bis(2-methyl-8-quinolinato) triphenylsilanolate aluminum (III), bis(2-methyl-8-quinolinato)4-phenolate aluminum (III), and bis(2-methyl-8-quinolinato)4-phenylphenolate aluminum (III), N,N'-diphenyl-N,N'-(3-methylphenyl)-1,1'-biphenyl-4,4'-diamine and poly(3-octyl-4-methylthiophene).

27. The light-emitting device according to claim 26 further comprising an encapsulating protective barrier.

28. A light-emitting display comprising a plurality of light-emitting devices according to claim 1, said light-emitting devices being mounted on a support.

29. A light-emitting display comprising a plurality of light-emitting devices according to claim 24, said light-emitting devices being mounted on a support.

30. A light-emitting display comprising a plurality of light-emitting devices according to claim 26, said light-emitting devices being mounted on a support.

31. A method of making a light-emitting device that comprises at least two organic PL materials, each of which emits EM radiation having one of two wavelength ranges, said method comprising:
(1) forming a light-emitting member in a process comprising the steps of:
providing a first electrode comprising a first electrically conducting material, and a second electrode comprising a second electrically conducting material;
disposing said at least two organic EL materials between said first and second electrodes; and
disposing a charge blocking material between said at least two organic EL; and
(2) disposing at least one PL material adjacent to said light-emitting member.

32. The method according to claim 31, wherein said disposing said at least two organic EL materials comprises disposing said organic EL materials together in a single layer.

33. The method according to claim 32, further comprising providing an electron-transporting material as a matrix for said organic EL materials in said single layer.

34. The method according to claim 31, wherein said disposing said at least two organic EL materials comprises disposing each of said organic EL materials in a different layer.

35. The method according to claim 34, further comprising providing an electron-transporting material as a matrix for each of said organic EL materials in said layer.

36. The method according to claim 31, further comprising disposing a layer of a scattering material adjacent to said light-emitting member.

37. The method according to claim 31, wherein said steps of disposing said first and second electrically conducting materials are selected from the group consisting of physical vapor deposition, chemical vapor deposition, and sputtering.

38. The method according to claim 31, wherein said step of disposing said at least two organic EL materials is selected from the group consisting of physical vapor deposition, chemical vapor deposition, spin coating, dip coating, spraying, ink-jet printing, and casting.

39. The method according to claim 31, wherein said at least one PL material is an organic PL material and said step of disposing said PL material comprises depositing said organic PL material by a method selected from the group consisting of physical vapor deposition, chemical vapor deposition, spin coating, dip coating, spraying, ink-jet printing, and casting.

40. The method according to claim 31, wherein said at least one PL material is an organic PL material and said step of disposing said PL material comprises dispersing said organic PL material in a substantially transparent polymeric material to form a mixture, casting said mixture into a film by a doctor blade method, during said film, and disposing said film adjacent to said light-emitting member.

41. The method according to claim 31, wherein said at least one PL material is an inorganic PL material and said step of disposing said PL material comprises depositing said inorganic PL material in a substantially transparent polymeric material to form a mixture and depositing said mixture on said organic PL material by a method selected from the group consisting of spin coating, dip coating, spraying, ink-jet printing, and casting.

42. The method according to claim 31, wherein said at least one PL material is an inorganic PL material and said step of disposing said PL material comprises depositing said inorganic PL material in a substantially transport polymeric material to form a mixture and casting said mixture into a film using a doctor blade method, curing said film, and disposing said film adjacent to said organic PL material.

43. The method according to claim 31, wherein said charge blocking material is selected from hole blocking materials and electron blocking materials, and said step of disposing said charge blocking material is carried by a method selected from the group consisting of physical deposition, chemical vapor deposition, spin coating, spray coating, and dip coating.

* * * * *